US011056765B2

(12) United States Patent
Kamgaing et al.

(10) Patent No.: US 11,056,765 B2
(45) Date of Patent: Jul. 6, 2021

(54) MICROELECTRONIC DEVICES DESIGNED WITH FOLDABLE FLEXIBLE SUBSTRATES FOR HIGH FREQUENCY COMMUNICATION MODULES

(71) Applicant: Intel Corporation, Santa Clara, CA (US)

(72) Inventors: Telesphor Kamgaing, Chandler, AZ (US); Georgios C. Dogiamis, Chandler, AZ (US); Sasha N. Oster, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 111 days.

(21) Appl. No.: 16/345,173

(22) PCT Filed: Dec. 20, 2016

(86) PCT No.: PCT/US2016/067800
§ 371 (c)(1),
(2) Date: Apr. 25, 2019

(87) PCT Pub. No.: WO2018/118025
PCT Pub. Date: Jun. 28, 2018

(65) Prior Publication Data
US 2019/0288371 A1 Sep. 19, 2019

(51) Int. Cl.
*H01Q 1/22* (2006.01)
*H01L 23/31* (2006.01)
(Continued)

(52) U.S. Cl.
CPC .......... *H01Q 1/2283* (2013.01); *H01L 23/13* (2013.01); *H01L 23/3128* (2013.01);
(Continued)

(58) Field of Classification Search
CPC .... H01Q 1/2283; H01Q 23/13; H01Q 9/0457; H01Q 13/10; H01L 23/3128;
(Continued)

(56) References Cited

U.S. PATENT DOCUMENTS 6,002,371 A * 12/1999 Mittler ................... H01Q 1/242
343/700 MS
6,480,157 B1 * 11/2002 Palmer ..................... H01Q 1/08
343/700 MS
(Continued)

FOREIGN PATENT DOCUMENTS

KR    10-2015-0116417    10/2015

OTHER PUBLICATIONS

International Search Report and Written Opinion for International Patent Application No. PCT/US2016/067800 dated Aug. 30, 2017, 13 pgs.

*Primary Examiner* — Don P Le
(74) *Attorney, Agent, or Firm* — Schwabe, Williamson & Wyatt, P.C.

(57) ABSTRACT

Embodiments of the invention include a microelectronic device that includes a first substrate having radio frequency (RF) circuits and a second substrate coupled to the first substrate. The second substrate includes a first section and a second section with the second substrate being foldable in order to obtain a desired orientation of an antenna unit of the second section for transmitting and receiving communications at a frequency of approximately 4 GHz or higher.

17 Claims, 6 Drawing Sheets

(51) Int. Cl.
*H01L 23/538* (2006.01)
*H01L 23/66* (2006.01)
*H01L 25/065* (2006.01)
*H01Q 1/38* (2006.01)
*H01L 23/13* (2006.01)
*H01Q 9/04* (2006.01)
*H01Q 13/10* (2006.01)
*H01L 23/00* (2006.01)
*H01L 23/498* (2006.01)
*H01Q 21/06* (2006.01)

(52) U.S. Cl.
CPC .......... *H01L 23/5383* (2013.01); *H01L 23/66* (2013.01); *H01L 25/0655* (2013.01); *H01Q 1/38* (2013.01); *H01Q 9/0457* (2013.01); *H01Q 13/10* (2013.01); *H01L 23/49816* (2013.01); *H01L 24/16* (2013.01); *H01L 24/48* (2013.01); *H01L 2223/6627* (2013.01); *H01L 2223/6677* (2013.01); *H01L 2224/16227* (2013.01); *H01L 2224/48227* (2013.01); *H01L 2924/1421* (2013.01); *H01L 2924/15159* (2013.01); *H01L 2924/15311* (2013.01); *H01L 2924/18161* (2013.01); *H01Q 21/064* (2013.01); *H01Q 21/065* (2013.01)

(58) Field of Classification Search
CPC . H01L 23/5383; H01L 23/66; H01L 25/0655; H01L 1/38; H01L 23/49816; H01L 21/065; H01L 21/064; H01L 24/16; H01L 24/48; H01L 2223/6627; H01L 2223/6677; H01L 2224/16227; H01L 2224/48227; H01L 2924/1421; H01L 2924/15159; H01L 2924/15311; H01L 2924/18161

USPC ....................................................... 343/878
See application file for complete search history.

(56) References Cited

U.S. PATENT DOCUMENTS

| | | | |
|---|---|---|---|
| 10,642,313 B1* | 5/2020 | Wu | G06F 3/0416 |
| 2002/0024468 A1* | 2/2002 | Palmer | H01Q 1/08 |
| | | | 343/702 |
| 2003/0016162 A1* | 1/2003 | Sasada | H01Q 23/00 |
| | | | 342/70 |
| 2003/0130015 A1* | 7/2003 | McTaggart | H01Q 9/27 |
| | | | 455/569.1 |
| 2003/0210204 A1* | 11/2003 | Chiang | H01Q 19/28 |
| | | | 343/893 |
| 2005/0246001 A1* | 11/2005 | Kast | B32B 3/30 |
| | | | 607/116 |
| 2006/0043199 A1 | 3/2006 | Baba et al. | |
| 2006/0192712 A1* | 8/2006 | Park | H01Q 1/243 |
| | | | 343/700 MS |
| 2006/0290514 A1 | 12/2006 | Sakama et al. | |
| 2007/0013599 A1 | 1/2007 | Gaucher et al. | |
| 2007/0013603 A1* | 1/2007 | Atkinson | G06K 19/077 |
| | | | 343/873 |
| 2013/0314283 A1* | 11/2013 | Hong | H01Q 9/0457 |
| | | | 343/700 MS |
| 2014/0073071 A1* | 3/2014 | Diorio | G06K 19/07745 |
| | | | 438/26 |
| 2014/0266973 A1* | 9/2014 | DeVries | H01P 11/001 |
| | | | 343/893 |
| 2016/0220814 A1* | 8/2016 | Chiao | A61N 1/36007 |
| 2017/0134870 A1* | 5/2017 | Helgeson | H04R 25/60 |
| 2019/0244072 A1* | 8/2019 | Forster | G06K 19/0779 |
| 2019/0394584 A1* | 12/2019 | Nikles | H01Q 1/24 |
| 2020/0243941 A1* | 7/2020 | Yuen | H01Q 9/065 |

\* cited by examiner

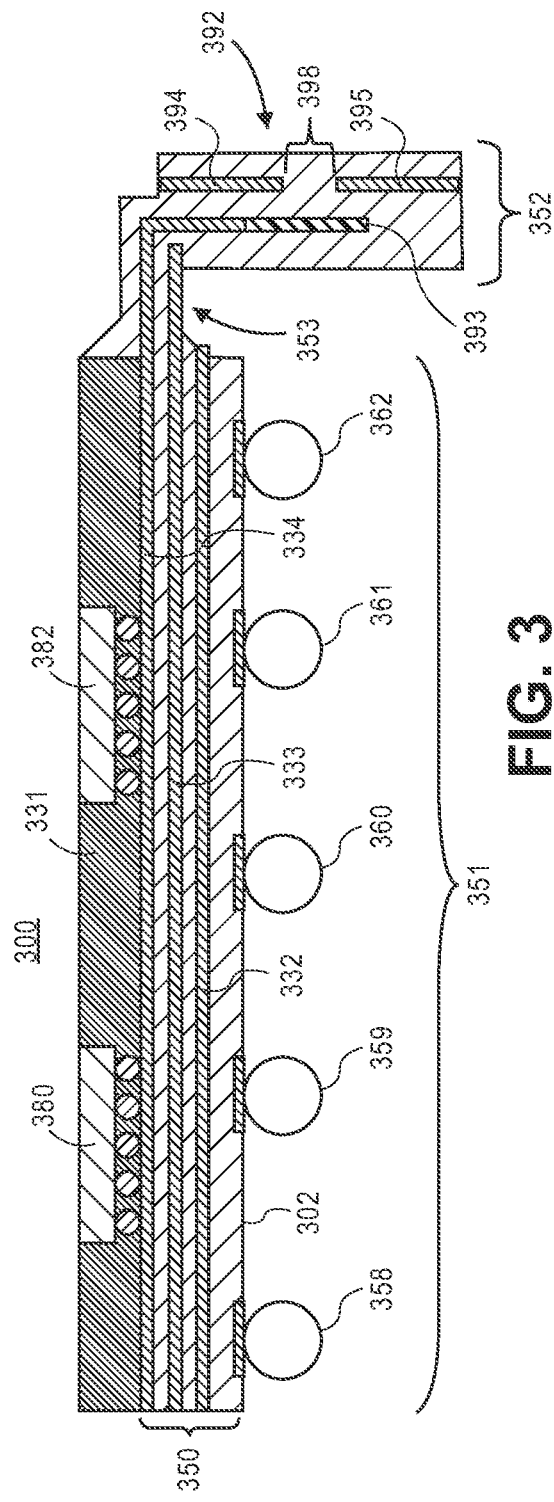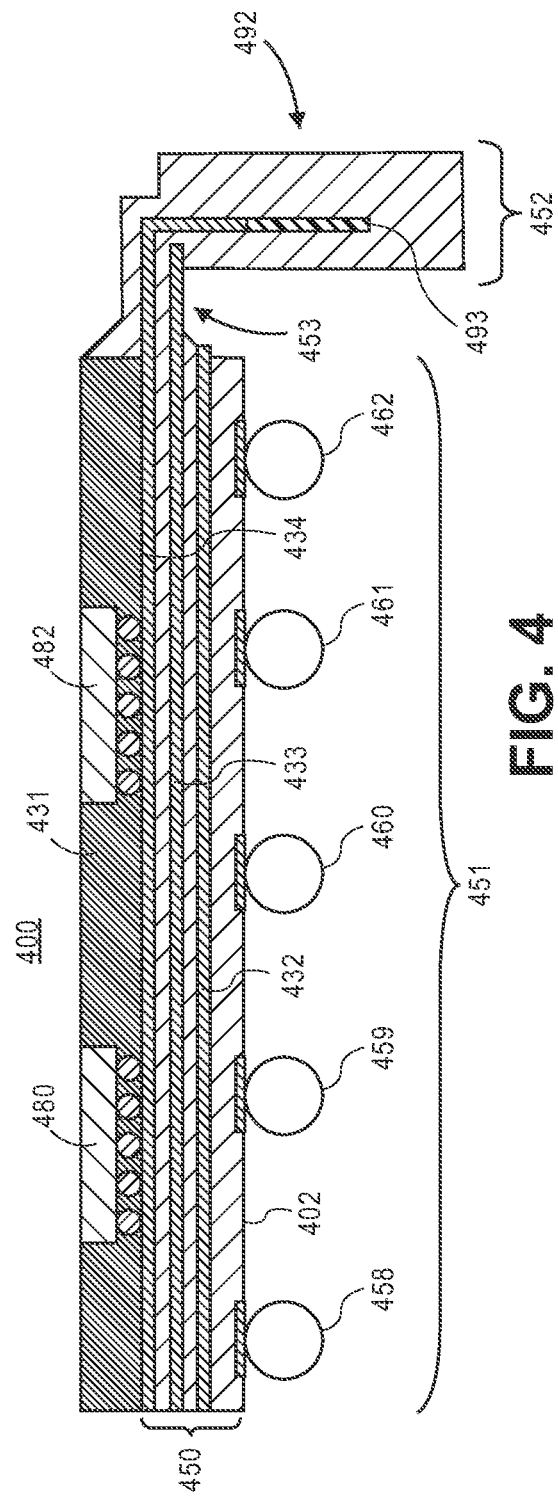

MICROELECTRONIC DEVICES DESIGNED WITH FOLDABLE FLEXIBLE SUBSTRATES FOR HIGH FREQUENCY COMMUNICATION MODULES

CROSS-REFERENCE TO RELATED APPLICATION

This patent application is a U.S. National Phase Application under 35 U.S.C. § 371 of International Application No. PCT/US2016/067800, filed Dec. 20, 2016, entitled "MICROELECTRONIC DEVICES DESIGNED WITH FOLDABLE FLEXIBLE SUBSTRATES FOR HIGH FREQUENCY COMMUNICATION MODULES," which designates the United States of America, the entire disclosure of which is hereby incorporated by reference in its entirety and for all purposes.

FIELD OF THE INVENTION

Embodiments of the present invention relate generally to the manufacture of semiconductor devices. In particular, embodiments of the present invention relate to microelectronic devices that are designed with foldable flexible substrates for high frequency communication modules.

BACKGROUND OF THE INVENTION

Future wireless products are targeting operation frequencies much higher than the lower GHz range utilized presently. For instance 5G ($5^{th}$ generation mobile networks or 5th generation wireless systems) communications is expected to operate at a frequency greater than or equal to 15 GHz. Moreover, the current WiGig (Wireless Gigabit Alliance) products operate around 60 GHz (e.g., 57-66 GHz worldwide).

Omni-directional propagation is important for wireless communication systems. For low frequency applications such as WiFi and LTE, the wavelength is very large (e.g., in the cm range). This makes it possible to create antennas with large aperture that are suitable for signal transmission over long distances using single element antennas. For future 5G wireless communication systems operating at millimeter wave frequencies, the wavelength becomes very small leading to small antenna sizes. In addition, free space transmission losses may be very large at some millimeter wave frequency bands of interest such as 60 GHz. Here, the communication is enabled by large and very directional phased array antennas. Most phased array antennas are implemented as planar antennas on a microelectronic package substrate and this reduces the 3-dB scanning angle to about +/−60 degrees.

BRIEF DESCRIPTION OF THE DRAWINGS

FIG. 3 illustrates a cross-sectional view of a microelectronic device having a foldable multi-section package substrate in accordance with one embodiment.

FIG. 4 illustrates a cross-sectional view of a microelectronic device having a foldable multi-section package substrate in accordance with one embodiment.

DETAILED DESCRIPTION OF THE INVENTION

Described herein are microelectronic devices that are designed with foldable flexible or semi-rigid microelectronic package or PCB substrates for high frequency communication modules. In the following description, various aspects of the illustrative implementations will be described using terms commonly employed by those skilled in the art to convey the substance of their work to others skilled in the art. However, it will be apparent to those skilled in the art that embodiments of the present invention may be practiced with only some of the described aspects. For purposes of explanation, specific numbers, materials and configurations are set forth in order to provide a thorough understanding of the illustrative implementations. However, it will be apparent to one skilled in the art that embodiments of the present invention may be practiced without the specific details. In other instances, well-known features are omitted or simplified in order to not obscure the illustrative implementations.

Various operations will be described as multiple discrete operations, in turn, in a manner that is most helpful in understanding embodiments of the present invention, however, the order of description should not be construed to imply that these operations are necessarily order dependent. In particular, these operations need not be performed in the order of presentation.

For high frequency (e.g., 5G, WiGig) wireless applications of millimeter (e.g., 1-10 mm, any mm wave) wave communication systems, the present design utilizes a new packaging architecture having ultra-thin functional packages to enable substrate bending and optimum antenna orientation and large spatial covering. Unlike a rigid substrate, the antenna is placed in a section of the package that can be folded to point the radiating beam in any desired direction.

The present design can integrate an active die with a thin package section of a communication module, thus allowing easy integration of the communication module in small form factor devices (e.g., cell phones, PDAs, tablets, ultrabooks, etc.).

The flexibility of the package substrate enables the orientation of the antenna in the desired direction. The positioning of the antenna away from a ground plane removes the need for a ground plane and allows one to use non-microstrip type antennas without concern on undesired feedback into RF circuits (e.g., transceivers). In one example, a stacked patch antenna on a bent end has higher gain than traditional endfire antennas such as Vivaldi radiators.

The 5G architecture operates at a high frequency (e.g., at least 20 GHz, at least 25 GHz, at least 28 GHz, at least 30 GHz, etc.) and may also have approximately 1-50 gigabits per second (Gbps) connections to end points. In another example, the present design operates at lower frequencies (e.g., at least 4 GHz, approximately 4 GHz).

Figure 1:
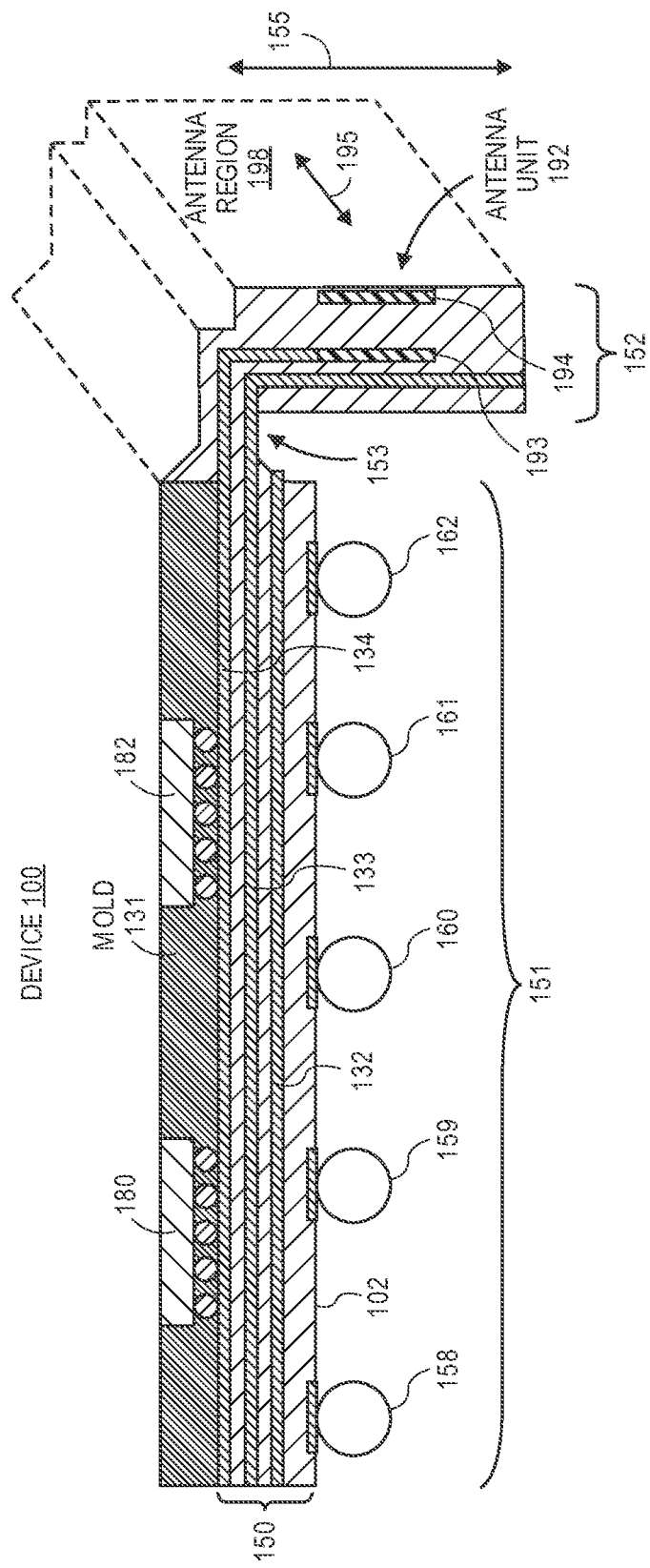
FIG. 1 illustrates a cross-sectional view of a microelectronic device having a foldable multi-section package substrate in accordance with one embodiment.

FIG. 1 illustrates a cross-sectional view of a microelectronic device having a foldable multi-section package substrate in accordance with one embodiment. The microelectronic device 100 includes an ultra-thin multi-layer organic package substrate 150 having a first section 151 and a second section 152. The first section 151 includes substrates 180 and 182 (e.g., semiconductor substrate, CMOS silicon substrate, SOI silicon substrate, Silicon carbide substrate, GaAs substrate, organic materials with at least one integrated functional active device, etc.) having RF circuits and mold material 131 to integrate the substrates 180 and 182 (e.g., dies 180 and 182) with the package substrate 150. The second section 152 is foldable to adjust a desired orientation of an antenna unit 192 with patches 193 and 194. The main patch 193 or bottom antenna element may be directly connected to any of the RF circuits of the dies 180 and 182 with a conductive layer 134. A conductive layer 133 may act as a ground plane. The package substrate 150 includes at least one antenna unit 192, conductive layers (e.g., 132-134), dielectric material 102 (e.g., organic material, low temperature co-fired ceramic materials, liquid crystal polymers, glass, etc.), and different levels of conductive connections and vias (not shown). The components of the substrate 150 can communicate with other components not shown in FIG. 1 using interconnect and solder balls 158-162. In one example, the ultra-thin multi-layer organic package substrate 150 in combination with the solder balls 158-162 has a thickness of 50 to 200 microns.

In one embodiment, the first section 151 includes an ultra-thin multilayer organic package substrate on which at least one semiconductor die (e.g., 180, 182) is attached using either wire bonding, bumpless or flip chip assembly. The semiconductor die contains at least a radio frequency circuit such as a transceiver that operates in the GHz frequency range. The microelectronic die is overmolded with overmold material 131 to provide mechanical stability. The second section 152 of the package contains one or multiple antennas and may extend along an axis 195 as indicated with antenna region 198. The section 152 may have a length 155 of approximately 2.5 millimeter for a frequency of 30 GHz and a length that is less than 1 millimeter for a frequency of 60 GHz when a single row of antenna elements/units is used. The length 155 may be increased to accommodate more rows of antenna units. The antennas may be individual or arranged in a phased array configuration. The antennas may be microstrip patch antennas with patches 193-194, transmission line 134, and a ground plane 133 behind the patches as illustrated in FIG. 1. Alternatively, the antennas may be a slot antenna, a dipole antenna or a monopole antenna. These types of antennas can be implemented with minimum risk of feedback coupling since these antennas are not sitting directly above the transceiver die (e.g., 180, 182). A thin foldable region 153 may be integrated with the second section 152 and a reduced number of conductive layers in the section 152 compared to the number of conductive layers in section 151 enables part of the package substrate to fold to orient the antennas in any desired direction. The patches of the antennas can be created during substrate manufacturing as part of the build up layers of the substrate 150.

Figure 2:
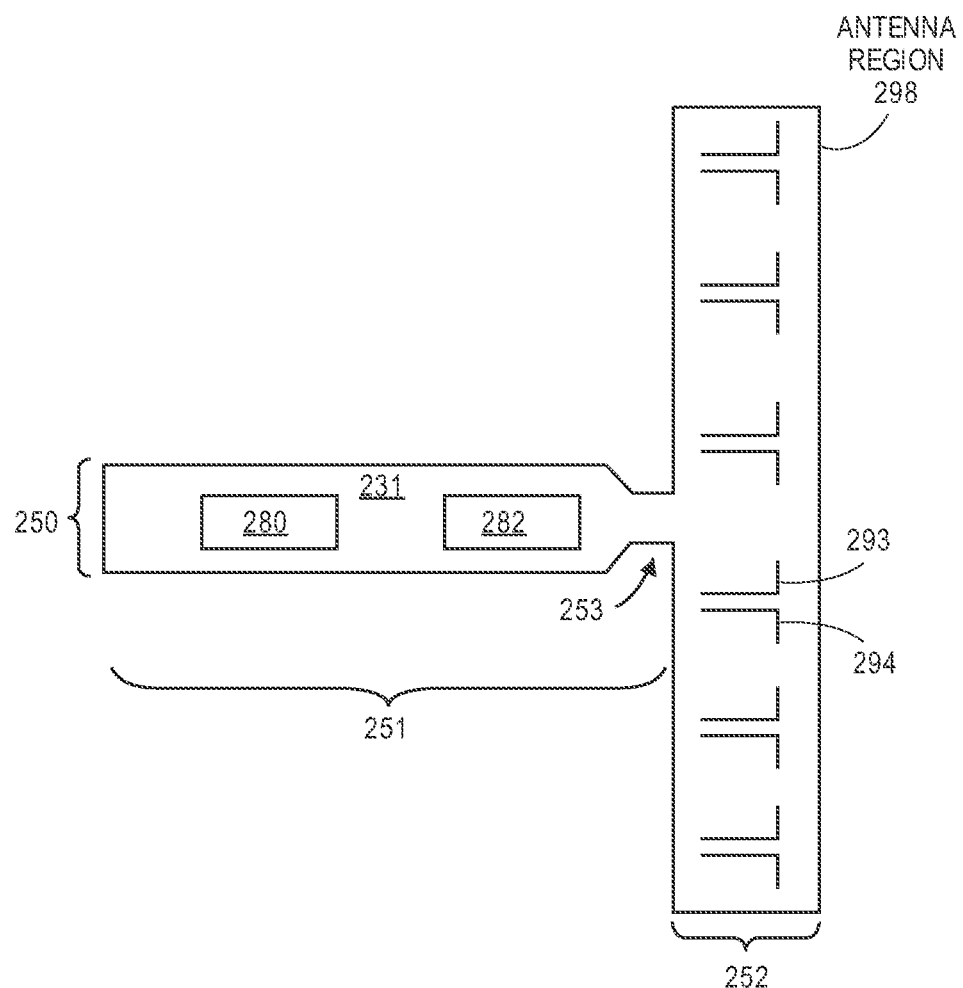
FIG. 2 illustrates a top view of a microelectronic device having a foldable multi-section package substrate in accordance with one embodiment.

FIG. 2 illustrates a top view of a microelectronic device having a foldable multi-section package substrate in accordance with one embodiment. The microelectronic device 200 includes an ultra-thin multi-layer organic package substrate 250 having a first section 251 and a second section 252. The first section 251 includes semiconductor substrates 280 and 282 (e.g., semiconductor substrate, CMOS silicon substrate, SOI silicon substrate, Silicon carbide substrate, GaAs substrate, organic materials with at least one integrated functional active device, etc.) having RF circuits and mold material 231 to integrate the substrates 280 and 282 (e.g., dies 280 and 282) with the microelectronic package substrate 250. The second section 252 is foldable to adjust a desired orientation of an antenna region 298 having a plurality of antennas with conductive elements (e.g., dipole elements 293 and 294). The antenna elements may be directly connected to any of the RF circuits of the dies 280 and 282 with a conductive layer. Another conductive layer may act as a ground plane. The package substrate 250 includes an antenna region 298, conductive layers, dielectric material (e.g., organic material, low temperature co-fired ceramic materials, liquid crystal polymers, glass, etc.), and different levels of conductive connections.

The antennas may be individual or arranged in a phased array configuration. The antennas may be microstrip patch antennas, slot antennas, dipole antennas or monopole antennas. These types of antennas can be implemented with minimum risk of feedback coupling since these antennas are not sitting directly above the transceiver die (e.g., 280, 282). A thin foldable region 253 may be integrated with the second section 252 and enables part of the package substrate to fold to orient the antennas in any desired direction. The conductive elements of the antennas can be created during substrate manufacturing as part of the build up layers of the substrate 150.

FIG. 3 illustrates a cross-sectional view of a microelectronic device having a foldable multi-section package substrate in accordance with one embodiment. The microelectronic device 300 includes an ultra-thin multi-layer organic package substrate 350 having a first section 351 and a second section 352. The first section 351 includes substrates 380 and 382 (e.g., semiconductor substrate, CMOS silicon substrate, SOI silicon substrate, Silicon carbide substrate, GaAs substrate, organic materials with at least one integrated functional active device, etc.) having RF circuits and mold material 331 to integrate the substrates 380 and 382 (e.g., dies 380 and 382) with the package substrate 350. The second section 352 is foldable to adjust a desired orientation of an antenna unit 392 with conductive elements 393-395. The conductive elements 394 and 395 are connected together as a ground plane. A slot 398 (e.g., opening 398) of a slot antenna is formed between conductive elements 394 and 395. In one example, conductive elements 394 and 395 are formed with a conductive layer having an aperture that is the opening 398. The conductive element 393 may be a controlled impedance structure such as a transmission line (e.g., microstrip, stripline, grounded coplanar waveguide, etc.) and may be directly connected to any of the RF circuits of the dies 380 and 382 with a conductive layer 334. A conductive layer 333 may act as a ground plane. The package substrate 350 includes at least one antenna unit 392, conductive layers (e.g., 332-334), dielectric material 302 (e.g., organic material, low temperature co-fired ceramic materials, liquid crystal polymers, glass, etc.), and different levels of conductive connections and vias (not shown). The components of the substrate 350 can communicate with other components not shown in FIG. 3 using interconnect and solder balls 358-362. In one example, the ultra-thin multi-layer organic package substrate 350 in combination with the solder balls 358-362 has a thickness of 50 to 200 microns.

In one embodiment, the first section 351 includes an ultra-thin multilayer organic package substrate on which at least one semiconductor die (e.g., 380, 382) is attached using either wire bonding, bumpless or flip chip assembly. The semiconductor die (e.g., 380 and 382) contains at least a radio frequency circuit such as a transceiver that operates in the GHz frequency range. The microelectronic die is overmolded with overmold material 331 to provide mechanical stability. The second section 352 of the package contains one or multiple antennas. The antennas may be individual or arranged in a phased array configuration. The antenna can be implemented with minimum risk of feedback coupling since these antennas are not sitting directly above the transceiver die (e.g., 380, 382). A thin foldable region 353 may be integrated with the second section 352 and enables part of the package substrate to fold to orient the antennas in any desired direction.

FIG. 4 illustrates a cross-sectional view of a microelectronic device having a foldable multi-section package substrate in accordance with one embodiment. The microelectronic device 400 includes an ultra-thin multi-layer organic package substrate 450 having a first section 451 and a second section 452. The first section 451 includes substrates 480 and 482 (e.g., semiconductor substrate, CMOS silicon substrate, SOI silicon substrate, Silicon carbide substrate, GaAs substrate, organic materials with at least one integrated functional active device, etc.) having RF circuits and mold material 431 to integrate the substrates 480 and 482 (e.g., dies 480 and 482) with the package substrate 450. The second section 452 is foldable to adjust a desired orientation of an antenna unit 492 with conductive element 493. The conductive element 493 can used for a monopole or dipole antenna. The conductive element 493 may be directly connected to any of the RF circuits of the dies 480 and 482 with a conductive layer 434. A conductive layer 433 may act as a ground plane. The package substrate 450 includes at least one antenna unit 492, conductive layers (e.g., 432-434), dielectric material 402 (e.g., organic material, low temperature co-fired ceramic materials, liquid crystal polymers, glass, etc.), and different levels of conductive connections and vias (not shown). The components of the substrate 450 can communicate with other components not shown in FIG. 4 using interconnect and solder balls 458-462. In one example, the ultra-thin multi-layer organic package substrate 450 in combination with the solder balls has a thickness of 50 to 200 microns.

In one embodiment, the first section 451 includes an ultra-thin multilayer organic package substrate on which at least one semiconductor die (e.g., 480, 482) is attached using either wire bonding, bumpless or flip chip assembly. The semiconductor die contains at least a radio frequency circuit such as a transceiver that operates in the GHz frequency range. The microelectronic die is overmolded with overmold material 431 to provide mechanical stability. The second section 452 of the package contains one or multiple antennas. The antennas may be individual or arranged in a phased array configuration. The antenna can be implemented with minimum risk of feedback coupling since these antennas are not sitting directly above the transceiver die (e.g., 480, 482). A thin foldable region 453 may be integrated with the second section 452 and enables part of the package substrate to fold to orient the antennas in any desired direction.

Figure 5:
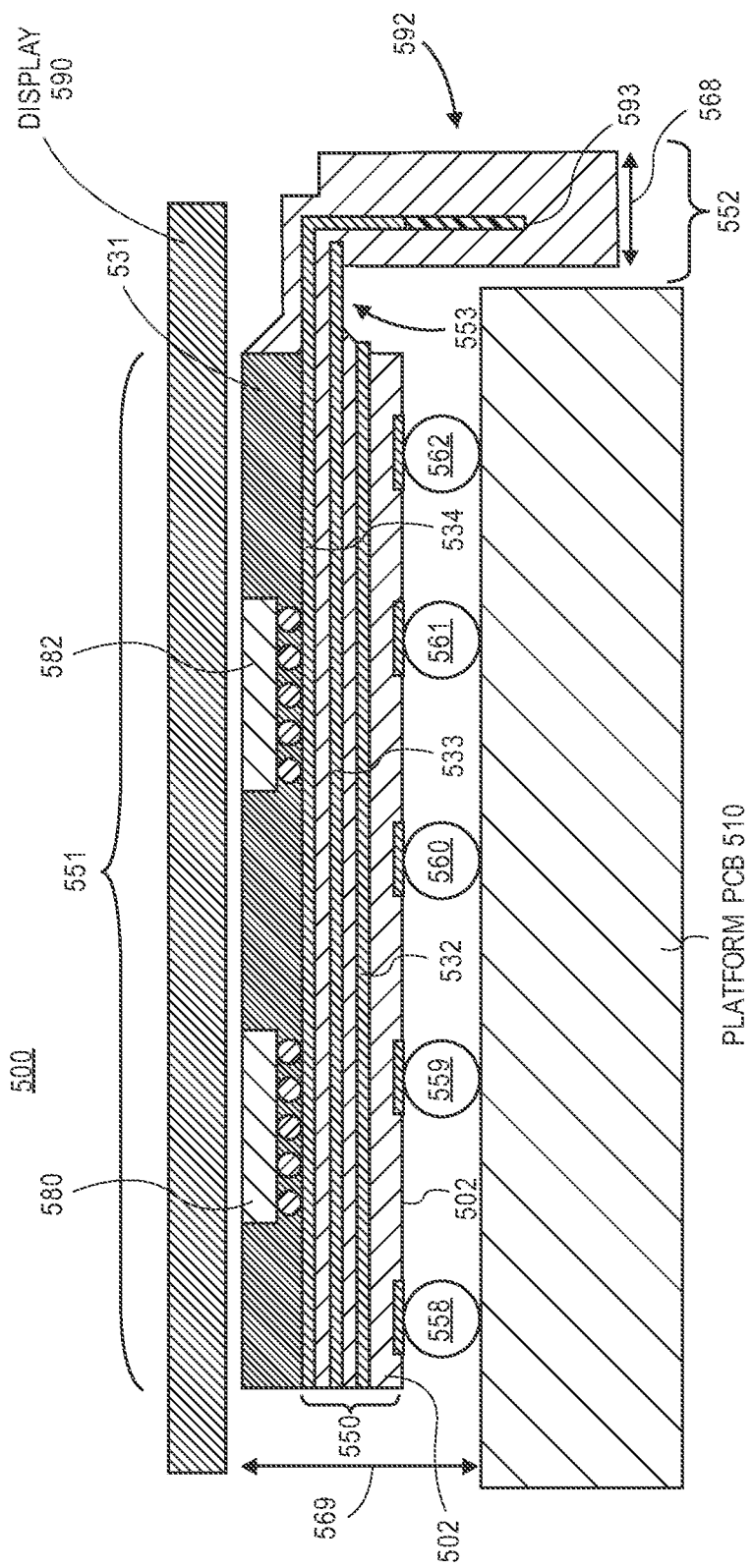
FIG. 5 illustrates a cross-sectional view of a microelectronic device having a foldable multi-section package substrate in accordance with one embodiment.

FIG. 5 illustrates a cross-sectional view of a microelectronic device having a foldable multi-section package substrate in accordance with one embodiment. The microelectronic device 500 includes an ultra-thin multi-layer organic package substrate 550 having a first section 551 and a second section 552. The first section 551 includes substrates 580 and 582 (e.g., semiconductor substrate, CMOS silicon substrate, SOI silicon substrate, Silicon carbide substrate, GaAs substrate, organic materials with at least one integrated functional active device, etc.) having RF circuits and mold material 531 to integrate the substrates 580 and 582 (e.g., dies 580 and 582) with the package substrate 550. The second section 552 is foldable to adjust a desired orientation of an antenna unit 592 with conductive element 593 that is illustrated to be perpendicular with respect to a length of the section 551. The conductive element 593 can be used for a monopole or dipole antenna. The conductive element 593 may be directly connected to any of the RF circuits of the dies 580 and 582 with a conductive layer 534. A conductive layer 533 may act as a ground plane. The package substrate 550 includes at least one antenna unit 592, conductive layers (e.g., 532-534), dielectric material 502 (e.g., organic material, low temperature co-fired ceramic materials, liquid crystal polymers, glass, etc.), and different levels of conductive connections (not shown). The components of the substrate 550 can communicate with other components including platform PCB 510 in FIG. 5 using interconnect and solder balls 558-562. In one example, the ultra-thin multi-layer organic package substrate 550 in combination with the solder balls 558-562 has a thickness 569 of 50 to 200 microns and section 552 may have a thickness 568 of 50 to 100 microns. A display 590 may be positioned in close proximity to an upper surface of the mold material 531 of the package substrate 550.

In one embodiment, the first section 551 includes an ultra-thin multilayer organic package substrate on which at least one semiconductor die (e.g., 580, 582) is attached using either wire bonding, bumpless or flip chip assembly. The semiconductor die contains at least a radio frequency circuit such as a transceiver that operates in the GHz frequency range. The microelectronic die is overmolded with overmold material 531 to provide mechanical stability. The second section 552 of the package contains one or multiple antennas. The antennas may be individual or arranged in a phased array configuration. The antenna can be implemented with minimum risk of feedback coupling since these antennas are not sitting directly above the transceiver die (e.g., 580, 582). A thin foldable region 553 may be integrated with the second section 552 and enables part of the package substrate to fold to orient the antennas in any desired direction.

Figure 6:
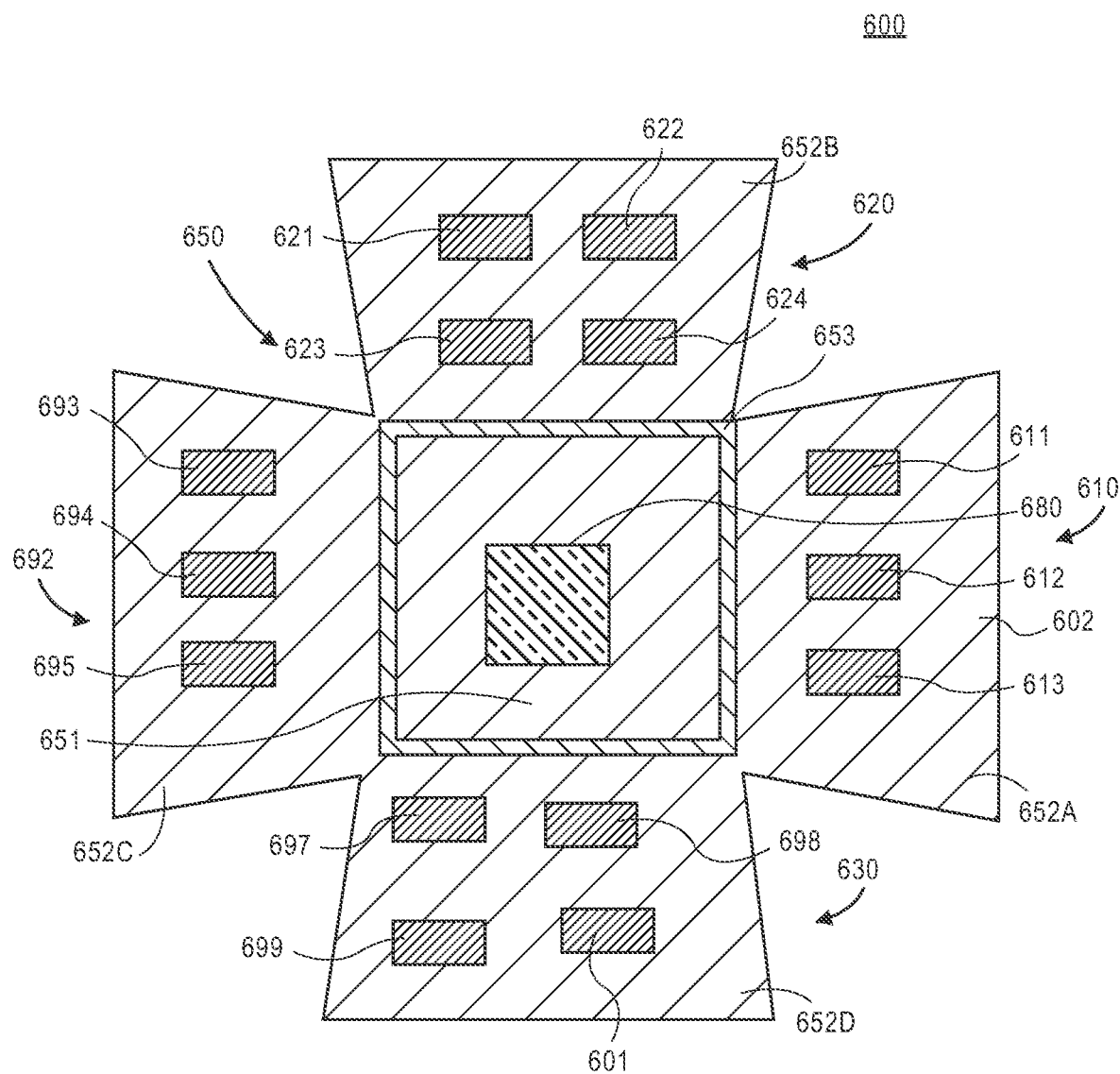
FIG. 6 illustrates a top view of a microelectronic device having a foldable multi-section package substrate in accordance with one embodiment.

FIG. 6 illustrates a top view of a microelectronic device having a foldable multi-section package substrate in accordance with one embodiment. The microelectronic device 600 includes an ultra-thin multi-layer organic package substrate 650 having a first section 651 and a second section 652A-D The first section 651 includes substrate 680 (e.g., semiconductor substrate, CMOS silicon substrate, SOI silicon substrate, Silicon carbide substrate, GaAs substrate, organic materials with at least one integrated functional active device, etc.) having RF circuits and mold material (not shown) to integrate the substrate 680 (e.g., die 680) with the package substrate 650. The second section 652A-D is foldable to adjust a desired orientation of antenna units 610, 620, 692, and 630. Each antenna unit includes conductive elements (e.g., 611-613, 621-624, 693-695, 697-699, 601). One or more of the conductive elements may be directly connected to any of the RF circuits of the die 680. A conductive layer may act as a ground plane. The package substrate 650 includes at least one antenna unit, conductive layers, dielectric material 602 (e.g., organic material, low temperature co-fired ceramic materials, liquid crystal polymers, glass, etc.), and different levels of conductive connections (not shown). The components of the substrate 650 can communicate with other components including a platform PCB in FIG. 5 using interconnect and solder balls.

In one embodiment, the first section 651 includes an ultra-thin multilayer organic package substrate on which at least one semiconductor die (e.g., 680) is attached using either wire bonding, bumpless or flip chip assembly. The semiconductor die contains at least a radio frequency circuit such as a transceiver that operates in the GHz frequency range. The microelectronic die is overmolded with overmold material to provide mechanical stability. The second section 652A-D of the package contains one or multiple antennas that can be oriented in different directions. The antennas may be individual or arranged in a phased array configuration. The antenna can be implemented with minimum risk of feedback coupling since these antennas are not sitting directly above the transceiver die (e.g., 680). A thin foldable region 653 may be integrated with the second section 652 and enables part of the package substrate to fold to orient the antennas in any desired direction. In some embodiments, additional dies may be attached to the foldable sections. Other passive components may be attached to the package or formed as part of the package. Sections of the package may be overmolded after folding or used in conjunction with other platform components that allow these sections to maintain a desired orientation or orientations during the time of use.

The package substrates and mold material can have different thicknesses, length, and width dimensions in comparison to those disclosed and illustrated herein. The mold material may be a low loss nonconductive dielectric material (e.g., filled epoxy material, silicones). The thin foldable regions (e.g., 153, 253, 353, 453, 553, 653) may have a width (e.g., width less than 50 microns, width less than 40 microns, width less than 30 microns, etc.) that allows the organic package substrate to be folded in this thin foldable region. The organic package substrate may also be folded in other regions as well.

In another embodiment, any of the devices or components can be coupled to each other.

It will be appreciated that, in a system on a chip embodiment, the die may include a processor, memory, communications circuitry and the like. Though a single die is illustrated, there may be none, one or several dies included in the same region of the wafer.

In one embodiment, the microelectronic device may be a crystalline substrate formed using a bulk silicon or a silicon-on-insulator substructure. In other implementations, the microelectronic device may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the scope of embodiments of the present invention.

Figure 7:
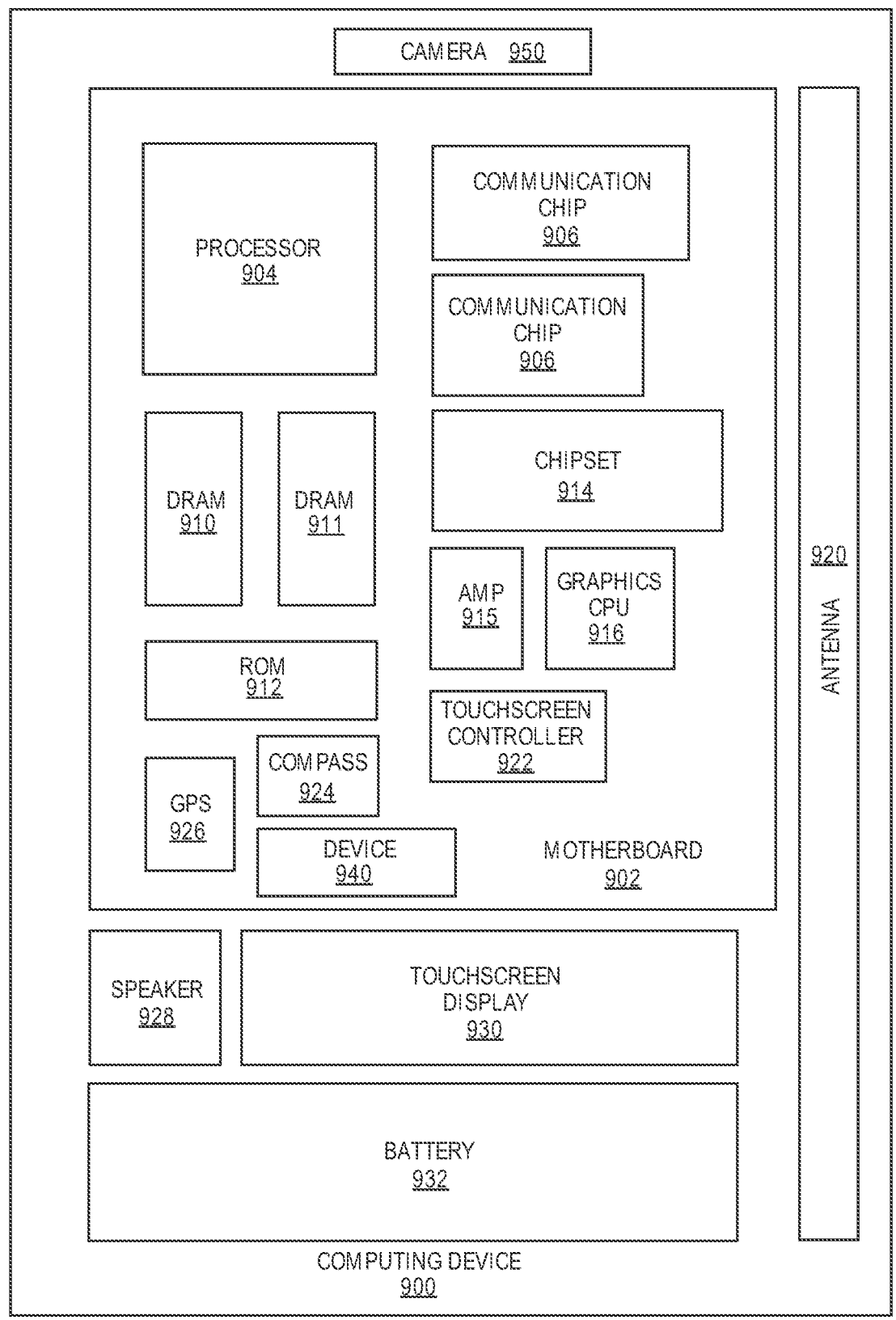
FIG. 7 illustrates a computing device 900 in accordance with one embodiment.

FIG. 7 illustrates a computing device 900 in accordance with one embodiment. The computing device 900 houses a board 902. The board (e.g., motherboard, printed circuit board, etc.) may include a number of components, including but not limited to at least one processor 904 and at least one communication module or chip 906. The at least one processor 904 is physically and electrically coupled to the board 902. In some implementations, the at least one communication module or chip 906 is also physically and electrically coupled to the board 902. In further implementations, the communication chip 906 is part of the processor 904. In one example, the communication module or chip 906 (e.g., microelectronic device 100, 200, 300, 400, 500, 600, etc.) includes an antenna unit 920 (e.g., antenna unit 192, 292, 392, 792, etc.).

Depending on its applications, computing device 900 may include other components that may or may not be physically and electrically coupled to the board 902. These other components include, but are not limited to, volatile memory (e.g., DRAM 910, 911), non-volatile memory (e.g., ROM 912), flash memory, a graphics processor 916, a digital signal processor, a crypto processor, a chipset 914, an antenna unit 920, a display, a touchscreen display 930, a touchscreen controller 922, a battery 932, an audio codec, a video codec, a power amplifier 915, a global positioning system (GPS) device 926, a compass 924, a gyroscope, a speaker, a camera 950, and a mass storage device (such as hard disk drive, compact disk (CD), digital versatile disk (DVD), and so forth).

The communication module or chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication module or chip 906 may implement any of a number of wireless standards or protocols, including but not limited to Wi-Fi (IEEE 802.11 family), WiMAX (IEEE 802.16 family), WiGig, IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication module or chip 906 may be dedicated to shorter range wireless communications such as Wi-Fi, WiGig, and Bluetooth and a second communication chip 906 may be dedicated to longer range wireless communications such as GPS, EDGE, GPRS, CDMA, WiMAX, LTE, Ev-DO, 5G, and others.

The at least one processor 904 of the computing device 900 includes an integrated circuit die packaged within the at least one processor 904. In some embodiments of the invention, the integrated circuit die of the processor includes one or more devices, such as microelectronic devices (e.g., microelectronic device 100, 200, 300, 400, 500, 600, etc.) in accordance with implementations of embodiments of the invention. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation of embodiments of the invention, the integrated circuit die of the communication chip includes one or more microelectronic devices (e.g., microelectronic device 100, 200, 300, 400, 500, 600, etc.).

The following examples pertain to further embodiments. Example 1 is a microelectronic device that includes a first substrate having radio frequency (RF) circuits and a second substrate coupled to the first substrate. The second substrate includes a first section and a second section with the second substrate being foldable in order to obtain a desired orientation of an antenna unit of the second section for transmitting and receiving communications at a frequency of approximately 4 GHz or higher.

In example 2, the subject matter of example 1 can optionally include the second substrate including an organic material and multiple conductive layers. The antenna unit has a perpendicular orientation with respect to a length of the first section based on folding of the second substrate.

In example 3, the subject matter of any of examples 1-2 can optionally include the second substrate including an organic material and multiple conductive layers. The antenna unit has a perpendicular orientation with respect to a length of the first section based on folding of the second substrate. The second section includes at least one less conductive layer than the first section.

In example 4, the subject matter of any of examples 1-3 can optionally include the antenna unit that includes at least one microstrip patch antenna.

In example 5, the subject matter of any of examples 1-4 can optionally include the antenna unit that includes at least one slot antenna, at least one dipole antenna, or at least one monopole antenna.

In example 6, the subject matter of any of examples 1-5 can optionally include the first substrate being overmolded to provide mechanical stability and die protection.

In example 7, the subject matter of any of examples 1-6 can optionally include the microelectronic device comprising a 5G package architecture for 5G communications.

Example 8 is a microelectronic device comprising a first substrate having radio frequency (RF) circuits and a second substrate coupled to the first substrate. The second substrate includes a first section, a second section, and a foldable section that is foldable to obtain a desired orientation of an antenna unit of the second section for transmitting and receiving communications at a frequency of approximately 4 GHz or higher.

In example 9, the subject matter of example 8 can optionally include the second substrate that includes an organic material and multiple conductive layers. The antenna unit has a perpendicular orientation with respect to a length of the first section.

In example 10, the subject matter of any of examples 8-9 can optionally include the foldable section that includes at least one less conductive layer than the first section.

In example 11, the subject matter of any of examples 8-10 can optionally include the antenna unit that includes at least one microstrip patch antenna.

In example 12, the subject matter of any of examples 8-11 can optionally include the antenna unit that includes at least one slot antenna, at least one dipole antenna, or at least one monopole antenna.

In example 13, the subject matter of any of examples 8-12 can optionally include the first substrate being overmolded to provide mechanical stability and die protection.

In example 14, the subject matter of any of examples 8-13 can optionally include the microelectronic device comprising a 5G package architecture for 5G communications.

Example 15 is a computing device that includes at least one processor to process data and a communication module or chip coupled to the at least one processor. The communication module or chip comprises, a first substrate having radio frequency (RF) circuits and a second substrate coupled to the first substrate. The second substrate includes a first section and a second section with the second substrate being foldable in order to obtain a desired orientation of an antenna unit of the second section for transmitting and receiving communications at a frequency of approximately 15 GHz or higher.

In example 16, the subject matter of example 15 can optionally include the second substrate that includes an organic material and multiple conductive layers. The antenna unit has a perpendicular orientation with respect to a length of the first section based on folding of the second substrate.

In example 17, the subject matter of any of examples 15-16 can optionally include the second section that includes at least one less conductive layer than the first section.

In example 18, the subject matter of any of examples 15-17 can optionally include the antenna unit that includes at least one microstrip patch antenna.

In example 19, the subject matter of any of examples 15-18 can optionally include the antenna unit that includes at least one slot antenna, at least one dipole antenna, or at least one monopole antenna.

In example 20, the subject matter of any of examples 15-19 can optionally include a printed circuit board coupled to the communication module or chip.

What is claimed is:
1. A microelectronic device comprising:
   a first substrate having radio frequency (RF) circuits; and
   a second substrate including a first section and a second section, the first section coupled to the first substrate, and the second section being foldable at a location in order to obtain a desired orientation of an antenna unit of the second section for transmitting and receiving communications at a frequency of approximately 4 GHz or higher, wherein the second substrate includes an organic material and multiple conductive layers, and wherein the second substrate has fewer conductive layers at the location where the second section is foldable than at a location beneath the first substrate.

2. The microelectronic device of claim 1, wherein the antenna unit has a perpendicular orientation with respect to a length of the first section based on folding of the second section of the second substrate.

3. The microelectronic device of claim 1, wherein the antenna unit includes at least one microstrip patch antenna.

4. The microelectronic device of claim 1, wherein the antenna unit includes at least one slot antenna, at least one dipole antenna, or at least one monopole antenna.

5. The microelectronic device of claim 1, wherein the first substrate is overmolded to provide mechanical stability and die protection.

6. The microelectronic device of claim 1, wherein the microelectronic device comprises a 5G package architecture for 5G communications.

7. A microelectronic device comprising:
   a first substrate having radio frequency (RF) circuits; and
   a second substrate including a first section and a second section, the first section coupled to the first substrate, and the second section folded at a location to obtain a desired orientation of an antenna unit of the second section for transmitting and receiving communications at a frequency of approximately 4 GHz or higher, wherein the second substrate includes an organic material and multiple conductive layers, and wherein the second substrate has fewer conductive layers at the location where the second section is folded than at a location beneath the first substrate.

8. The microelectronic device of claim 7, wherein the antenna unit has a perpendicular orientation with respect to a length of the first section of the second substrate.

9. The microelectronic device of claim 7, wherein the antenna unit includes at least one microstrip patch antenna.

10. The microelectronic device of claim 7, wherein the antenna unit includes at least one slot antenna, at least one dipole antenna, or at least one monopole antenna.

11. The microelectronic device of claim 7, wherein the first substrate is overmolded to provide mechanical stability and die protection.

12. The microelectronic device of claim 7, wherein the microelectronic device comprises a 5G package architecture for 5G communications.

13. A computing device comprising:

at least one processor to process data; and a communication module or chip coupled to the at least one processor, the communication module or chip comprises, a first substrate having radio frequency (RF) circuits, a second substrate including a first section and a second section, the first section coupled to the first substrate, and the second section being folded at a location in order to obtain a desired orientation of an antenna unit of the second section for transmitting and receiving communications at a frequency of approximately 15 GHz or higher, wherein the second substrate includes an organic material and multiple conductive layers, and wherein the second substrate has fewer conductive layers at the location where the second section is folded than at a location beneath the first substrate.

14. The computing device of claim 13, wherein the antenna unit has a perpendicular orientation with respect to a length of the first section of the second substrate.

15. The computing device of claim 13, wherein the antenna unit includes at least one microstrip patch antenna.

16. The computing device of claim 13, wherein the antenna unit includes at least one slot antenna, at least one dipole antenna, or at least one monopole antenna.

17. The computing device of claim 13, further comprising:

a printed circuit board coupled to the communication module or chip.

* * * * *